United States Patent [19]

Pinkhasov

[11] Patent Number: 4,575,401
[45] Date of Patent: Mar. 11, 1986

[54] METHOD OF AND APPARATUS FOR THE DRAWING OF BARS OF MONOCRYSTALLINE SILICON

[75] Inventor: Eduard Pinkhasov, Mt. Vernon, N.Y.

[73] Assignee: Wedtech Corp, Bronx, N.Y.

[21] Appl. No.: 618,192

[22] Filed: Jun. 7, 1984

[51] Int. Cl.[4] .............................................. C30B 15/14
[52] U.S. Cl. ................................ 156/602; 156/617 M; 422/249
[58] Field of Search ............ 156/617 M, 617 SP, 602, 156/DIG. 83, DIG. 64; 422/248, 249

[56] References Cited

U.S. PATENT DOCUMENTS

| 3,160,497 | 12/1964 | Loung | 156/617 M |
| 3,261,722 | 7/1966 | Keller et al. | 156/617 M |
| 4,116,642 | 9/1978 | Chu et al. | 422/249 |
| 4,133,969 | 1/1979 | Zumbrunnen | 156/617 M |
| 4,165,361 | 8/1979 | Milstein | 422/249 |

Primary Examiner—Hiram H. Bernstein
Attorney, Agent, or Firm—Karl F. Ross; Herbert Dubno

[57] ABSTRACT

High-purity silicon bars can be produced by electrically melting a portion of a mass of silicon granules in a crystal so that the mass around the melt isolates the melt from the crucible wall and thereby prevents contamination of the melt from the crucible and softening of the crucible wall by the melting heat. The current flow is promoted by the heating of the silicon granules and/or electrodes and a seed can be lowered into the melt so that a bar can be withdrawn therefrom for cutting up into wafers for use in the production of semiconductors.

10 Claims, 4 Drawing Figures

METHOD OF AND APPARATUS FOR THE DRAWING OF BARS OF MONOCRYSTALLINE SILICON

FIELD OF THE INVENTION

My present invention relates to the melting of elemental silicon, to the formation of high-purity elemental silicon melts and to the drawing of monocrystalline bars of silicon which can be cut up to form silicon wafers, e.g. for the production of semiconductors, integrated circuits and the like.

BACKGROUND OF THE INVENTION

Monocrystalline silicon wafers are of considerable significance in the production of semiconductive circuit elements for present-day and future high technology. The production of such silicon wafers generally requires the lowering of a high-purity monocrystalline silicon seed into a melt of elemental silicon contained in a quartz crucible or vessel which must, because of its sensitivity to the temperature at which the melt must be held, generally be supported in a graphite or carbon outer vessel. Usually the crucible and the seed, as the latter is retracted, are relatively rotated and controlled cooling is effected so that the bar which is drawn from the melt or grown on the seed has a monocrystalline structure.

The bar is then cut up transversely to wafers of the desired thickness. The process is carried out under a controlled atmosphere or vacuum to minimize contamination of the bar, the silicon melt and the wafers.

In general, the melt in the quartz crucible is maintained at the requisite temperature for drawing the silicon bar, say, 1400° to 1450° C. by induction heating via an induction-heating coil located outside the quartz crucible and surrounding the supporting carbon vessel. Since the heat is applied from the exterior inwardly, the quartz wall and the outer portions of the malt may be at a somewhat higher temperature than the silicon melt or points within the body of the melt.

At these high temperatures, which are close to the softening point of the melt, material from the crucible tends to diffuse into the melt, the crucible has a tendency to soften under the mechanical stresses which arise at the high temperatures and because of the fact that these high temperatures must be maintained for the entire bar-drawing process. Such periods may be tens of hours in duration.

As a consequence, deformation and deterioration of the crucibles is a significant problem and one which can be attacked by a method as described in my commonly assigned application Ser. No. 614,434, filed May 25, 1984 and entitled METHOD OF COATING CERAMICS AND QUARTZ CRUCIBLES WITH MATERIAL ELECTRICALLY TRANSFORMED INTO A VAPOR PHASE. That application is a continuation-in-part of my copending application Ser. No. 494,302 filed May 13, 1983 as a continuation-in-part of Ser. No. 358,186 of Mar. 15, 1982 (U.S. Pat. No. 4,438,183), in turn a continuation-in-part of Ser. No. 237,670 filed Feb. 24, 1981 (U.S. Pat. No. 4,351,855), incorporating the subject matter of Disclosure Documents Nos. 078,337, 078,334 and 078,329, all of Feb. 26, 1979 and Disclosure Document No. 082,283 of July 5, 1979. In that system, compounds of silicon formed in situ such as silicon carbide and silicon nitride can be deposited on the inner surface of the quartz crucible as a protective coating. Such coating, of course, can only be of limited effectiveness because the softening effect is not eliminated although the coating provides a significant reduction in the migration of contaminants from the crucible into the melt.

OBJECTS OF THE INVENTION

It is the principal object of the present invention to provide a method of melting high-purity silicon whereby the disadvantages described above are obviated and especially the tendency for contamination of the melt and silicon by the retaining crucible is reduced.

Another object of this invention is to provide a method of maintaining a high-purity melt at a crystal-drawing temperature for long periods of time without deterioration of the crucible.

Still another object of my invention is to provide an improved method of drawing silicon bars such that at least some of the problems encountered in the production of such bars heretofore are eliminated.

It is also an object of this invention to provide an efficient apparatus for carrying out the improved method.

SUMMARY OF THE INVENTION

These objects and others which will become apparent hereinafter are attained, in accordance with the present invention, which provides a method of forming and maintaining a high-purity silicon melt and of drawing monocrystalline silicon bars from such a melt which is based upon my discovery that it is possible effectively to isolate the melt from the walls of the crucible containing the elemental silicon at least over a substantial portion of the process and thereby avoid deterioration of the crucible and migration of impurities from the crucible into the melt.

Generally speaking, elemental silicon is considered a poor thermal conductor and at standard temperature is likewise a poor electrical conductor. I have found, however, when a granular or particulate mass of silicon is filled into a quartz crucible between two electrodes and the elemental silicon granules are heated in the region between these electrodes, they become sufficiently electrically conductive to be further heated and melted by the passage of an electric current through the mass between the electrodes.

Since the melt is isolated by the balance of the body of granular silicon from contact with the walls of the crucible, heat conduction to the latter is poor and the crucible can be at a substantially lower temperature than the melting point of the silicon so that softening and distortion do not occur and, indeed the crucible need not be supported in a carbon structure.

Furthermore, since a layer of granular elemental silicon remains between the melt and the vessel wall during most of the melting and crystal growing operation, it can serve as a barrier to migration of impurities from that wall into the melt that is formed.

When the invention is applied to the melting of silicon, therefore, a mass of the particulate solid elemental silicon, e.g. elemental silicon granules, is filled into a quartz crucible which is equipped with a pair of electrodes and an electric current is passed through this mass between the electrodes. The mass can be initially heated, e.g. with these electrodes or by other means, to establish the initial conductivity and then a melting current is supplied and is maintained as long as the melt continues to form. The melting is effected between the electrodes over a limited portion of the mass so that at least a layer of the granulates remains to isolate the melt from the wall and floor of the crucible. The additional granules can be fed to the melt or the melt can replenish itself, e.g. as the electrodes recede, from the mass of granules in the crucible and a monocrystalline seed can be lowered into the melt and the monocrystalline bar drawn from the melt.

I can also utilize, at least for the initial heating, my discovery that when a voltage is applied across a loosely piled mass of silicon granules, the slight conductivity of the latter is superimposed upon local contact resistances between the granules so that for a given current through these contact resistances R the product $I^2R$ is sufficient to ensure heating of the granules and further increase in conductivity, increase in contact and, assuming sufficient flow of current, melting of the granules.

BRIEF DESCRIPTION OF THE DRAWING

The above and other objects, features and advantages of the present invention will become more readily apparent from the following description, reference being made to the accompanying drawing in which.

SPECIFIC DESCRIPTION

Figure 1:
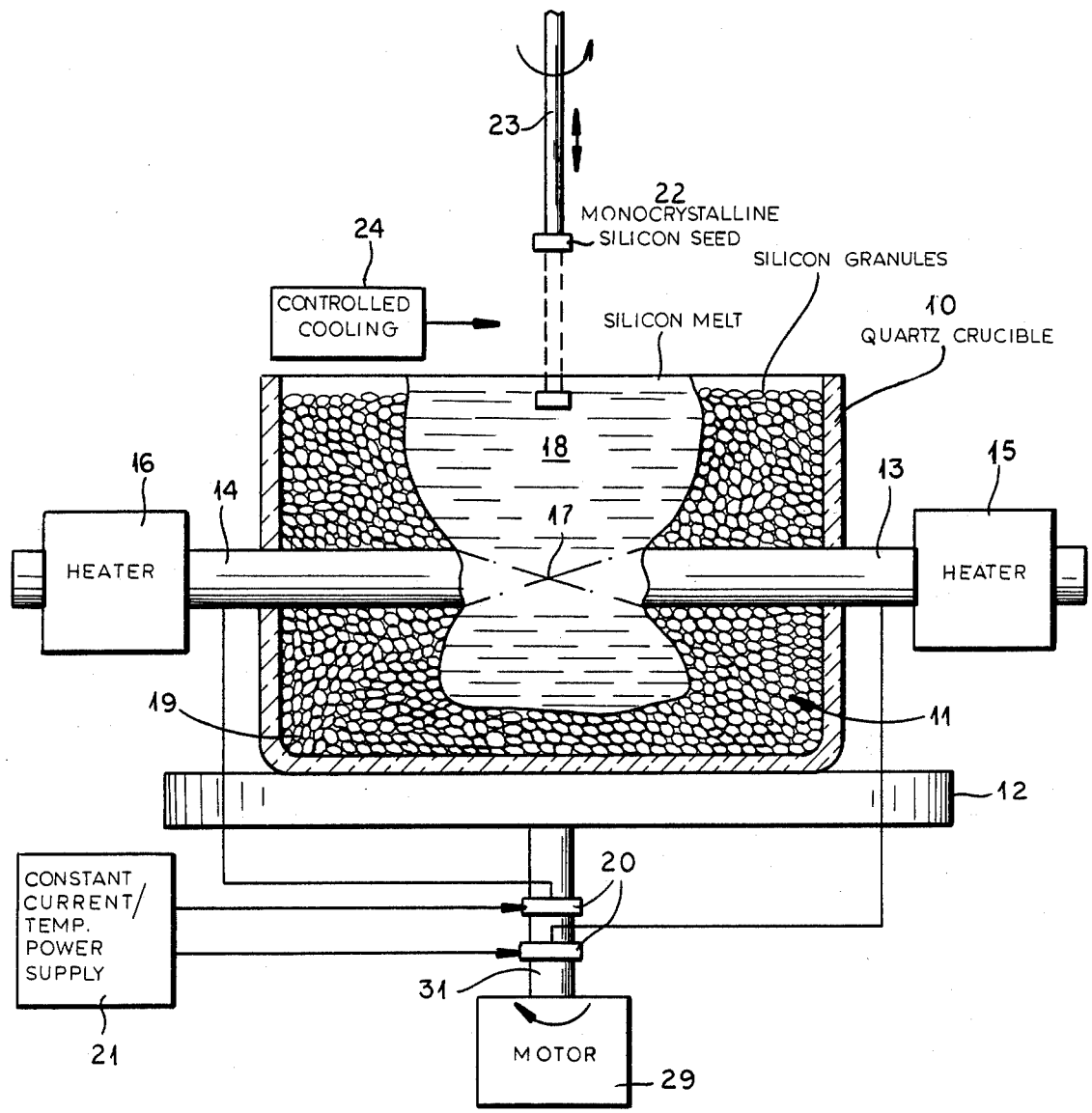
FIG. 1 is a diagrammatic section through an apparatus for carrying out the method of the invention.

The apparatus diagrammatically illustrated in FIG. 1 comprises a quartz crucible 10 which can be seen to be nonreinforced and nonsupported and hence a contrast to the graphite-enclosed and graphite-supported crucibles hitherto utilized for the melting of elemental silicon. The elemental silicon granules 11 are filled into said crucible which is mounted on a turntable 12 and can be rotated by a motor 29.

A pair of silicon electrodes 13, 14 are sealed in the wall of the crucible 10 and are provided with respective heaters 15, 16 which serve to raise the temperature of these electrodes so as to render them sufficiently electrically conductive that an electric current can be passed to the mass between them. Initially, the electrodes can be in contact as shown by the dot-dash lines 17 and with the initial passage of an electric current the presence of a contact point causes the electrodes to burn away or melt and adjacent granules to melt. Further passage of electric current, now flowing freely through the melt, generates additional heat which melts additional quantities of the silicon granules to form a piston 18 thereof which is surrounded by a body or layer 19 of granules constituting an insulating layer interposed between the melt and the quartz crucible. The melt current is delivered to the electrodes 13, 14 by brushes 20 on the shaft 31 and of the motor 13, the brushes 20 being connected to the high current power supply 21.

A monocrystalline silicon seed 22 can be lowered into the melt 18 on a rod 23 and the rod 23 is then retracted as the motor 29 rotates the crucible and the rod 23 is also rotated to draw a bar of monocrystalline silicon which is controlledly cooled as represented by the means 24. When drawing reaches its maximum the bar can be cut off and severed in the usual manner into wafers.

Figure 2:
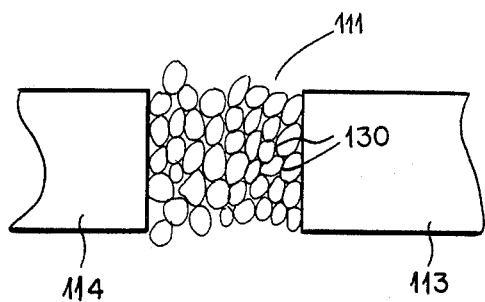
FIG. 2 is a diagram illustrating principles involved in a modified initial heating of silicon granules.

In FIG. 2, a different principle for the initial melting is described. Here the electrodes 113 and 114 are shown to be bridged by the mass of silicon granules. When the electric current is supplied, the flow is concentrated at the current points 130 between the granules at the current resistance. These locations are comparatively of high resistance and ohmic heating occurs. The ohmic heating increases the conductivity of the particles and hence allows additional current flow with resultant increase in the overall heating effect until incipient melting develops. With such melting, of course, the conductivity increases further as the molten silicon is far more conductive than the granular mass and the melt is formed in the manner described. Where this system is used, a layer of unmelted granular silicon is maintained between the wall of the crucible and the mouth.

Figure 3:
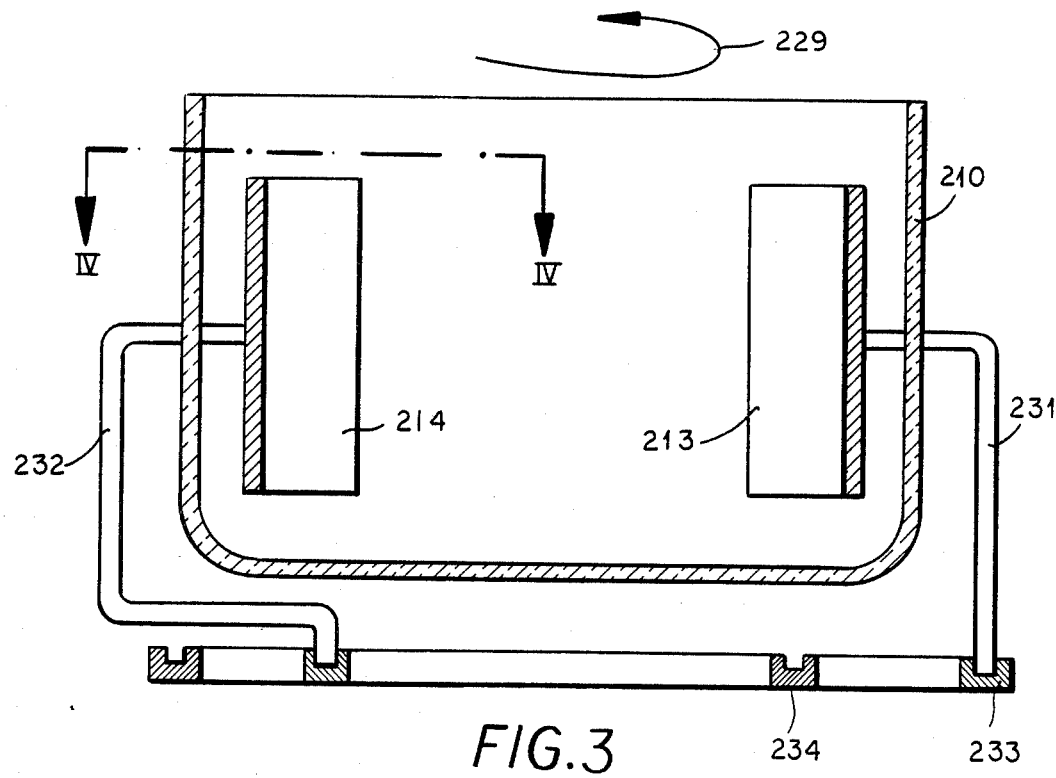
FIG. 3 shows, also in section, another crucible for carrying out the method of the invention.
Figure 4:
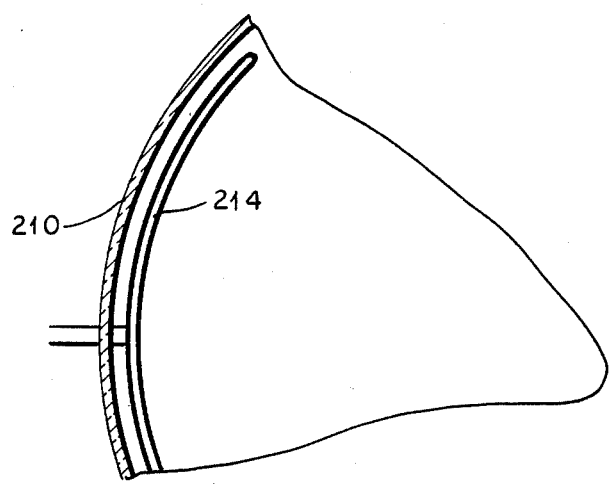
FIG. 4 is a fragmentary section taken along the line IV—IV of FIG. 3.

In FIGS. 3 and 4 I have shown another crucible for carrying out this method. Here the crucible 210 is also rotated as shown by the arrow 229 and is provided with a pair of arcuate electrodes 213 and 214. To facilitate such rotation, the arcuate electrodes 213 and 214 are provided with respective bars 231, 232 engaging in the respective annular contact rail 233, 234 connected to the melting contact source. In this case, the granules between the electrodes may be heated previously, e.g. with a torch or radiant heating means to promote conductivity or can be heated by passage of an electric current through the mass utilizing the principles represented in FIG. 2. By way of example, I have found that it is possible to melt silicon granules in quartz crucibles reaching a diameter from 4 to 16" and utilizing 80 to 100 volts or more and supplying 80 to 100 amperes to the preheated mass initially and voltages of 70 to 80 V with currents of 30 to 40 amperes at 40 to 50 volts for subsequent maintenance of the melt during the drawing of monocrystalline bars therefrom. The silicon granules can range in size from 1 mm to substantially 10 mm although larger and smaller granules can be utilized and can have irregular or regular contours.

I claim:

1. A method of melting elemental silicon which comprises the steps of:
    filling a mass of elemental silicon granules into a crucible; and
    passing an electric current through only a portion of said mass between electrodes which are at least in part surrounded by said mass and are in contact with said granules outwardly of said portion, said electric current being passed with an intensity sufficient to melt said portion while leaving at least a layer of said granules between the resulting melt and the walls of said crucible, thereby insulating said walls from said melt and interposing a barrier to contamination from said crucible to said melt.

2. The method defined in claim 1 wherein said portion of said mass is preheated before the passage of electric current therethrough.

3. The method defined in claim 1 wherein said portion of said mass is heated at least in part prior to the melting thereof by the passage of an electric current across said portion of said mass such that resistant heating occurs at contact points between granules of said portion of said mass.

4. A method of producing elemental silicon bars for the production of silicon wafers which comprises the steps of:
- (a) filling a mass of elemental silicon granules into a crucible;
- (b) inserting a pair of electrodes into said mass such that a portion of said mass is received between said electrodes;
- (c) passing an electric current through said portion of said mass between said electrodes of an intensity sufficient to melt and portion of said mass and form a bath of melt and silicon enclosed in at least a layer of unmelted granules whereby said layer isolates said bath from said crucible; and
- (d) maintaining said bath molten by continuously passing an electric current through said bath while drawing a crystalline bar of silicon therefrom

5. The method defined in claim 4 wherein said portion of said mass is preheated prior to the passage of electric current therethrough to increase the conductivity of said portion of said mass.

6. The method defined in claim 4 wherein said electrodes are composed of silicon, further comprising the step of heating said electrodes to increase the conductivity thereof.

7. The method defined in claim 4 wherein said crucible is composed of quartz.

8. The method defined in claim 4, further comprising the step of relatively rotating said bar and said crucible upon the drawing of said bar from said melt.

9. The method defined in claim 4 wherein said bar is drawn from said melt by lowering a monocrystalline silicon seed into said melt and withdrawing said seed with said bar extending therefrom from said melt.

10. An apparatus for producing a silicon bar, comprising:
- a quartz crucible containing a mass of silicon granules;
- a pair of electrodes extending into said mass;
- means connected to said electrodes for passing electric current through a portion of said mass to form a bath of molten silicon in said crucible surrounded by at least a layer of said granules, whereby said layer forms an insulating barrier supporting said bath and isolating same from said crucible;
- means for introducing a monocrystalline silicon seed into said bath; and
- means for drawing said seed and a bar of molten silicon from said bath while the latter continues to be heated by the passage of an electric current therethrough.

* * * * *